United States Patent
Riedmann et al.

(10) Patent No.: US 12,101,876 B2
(45) Date of Patent: Sep. 24, 2024

(54) CIRCUIT MODULE FOR MOUNTING HIGH FREQUENCY CIRCUIT CARRIERS

(71) Applicant: Rohde & Schwarz GmbH & Co. KG, Munich (DE)

(72) Inventors: Nico Riedmann, Munich (DE); Dominik Kressirer, Finsing (DE); Anna-Katharina Burger, Schonstett (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 217 days.

(21) Appl. No.: 17/896,843

(22) Filed: Aug. 26, 2022

(65) Prior Publication Data
US 2024/0074036 A1     Feb. 29, 2024

(51) Int. Cl.
*H05K 1/02*     (2006.01)
*H05K 1/18*     (2006.01)

(52) U.S. Cl.
CPC .......... *H05K 1/0237* (2013.01); *H05K 1/181* (2013.01)

(58) Field of Classification Search
CPC .............................. H05K 1/0237; H05K 1/181
USPC ...................................................... 361/760
See application file for complete search history.

(56) References Cited

U.S. PATENT DOCUMENTS

| 6,812,580 | B1 | 11/2004 | Wenzel et al. | |
|---|---|---|---|---|
| 2014/0372259 | A1* | 12/2014 | Elberbaum | H04L 65/60 705/26.81 |
| 2015/0116957 | A1* | 4/2015 | Chuang | G06F 1/16 361/748 |
| 2022/0189841 | A1 | 6/2022 | Li et al. | |

FOREIGN PATENT DOCUMENTS

| DE | 102012012171 A1 | 8/2013 |
|---|---|---|
| EP | 0121374 A1 | 10/1984 |
| EP | 2101550 A1 | 9/2009 |
| WO | 2013120994 A1 | 8/2013 |

* cited by examiner

*Primary Examiner* — Andargie M Aychillhum
(74) *Attorney, Agent, or Firm* — DITTHAVONG, STEINER & MLOTKOWSKI

(57) ABSTRACT

A circuit module comprising a printed circuit board, PCB, arrangement, a connection module, CM, and a high frequency circuit carrier, HFCC, are provided. The HFCC is arranged on the PCB arrangement. The CM is mounted on the PCB arrangement. The CM comprises at least one connection pad and is configured to electrically connect a metallic structure on or in the printed circuit board to the connection pad of the CM. The HFCC comprises at least one connection pad. At least one bond wire is provided to electrically connect the at least one connection pad to the HFCC to the at least one connection pad of the CM. The CM has a height over the PCB so that the at least one connection pad of the HFCC and at least one connection pad of the CM are on a same level or have a height difference that is less than 2 mm, preferably less than 1 mm, most preferably less than 0.8 mm.

15 Claims, 10 Drawing Sheets

CIRCUIT MODULE FOR MOUNTING HIGH FREQUENCY CIRCUIT CARRIERS

TECHNICAL FIELD

The invention relates to mounting high frequency circuit carriers, especially microchips or thin film circuits on a circuit board, preferably a printed circuit board.

BACKGROUND ART

When mounting high frequency circuit carriers, especially microchips or thin film circuits onto circuit boards, especially printed circuit boards, different temperature coefficients of the employed materials make a direct mount difficult.

The document DE 10 2012 012171 A1 shows a mounting of a high frequency circuit carrier on a printed circuit board. Especially here, a part of the circuit board is machined, so as to form a recess, in which the high frequency circuit carrier is placed.

The different temperature coefficients of the employed materials result in a sub-optimal mounting stability of the high frequency circuit carrier. Also, the machining step is cumbersome.

The object of the invention therefore is to provide a circuit module for mounting high frequency circuit carriers, which ensures a stable mounting, while at the same time requiring only a minimal workload. Also, the object of the invention is to provide an according mounting method.

SUMMARY OF THE INVENTION

According to a first aspect of the invention, a circuit module is provided. The circuit module comprises a printed circuit board, PCB, arrangement, a connection module, CM, and a high frequency circuit carrier, HFCC. The HFCC is arranged on the PCB arrangement. The CM is mounted on the PCB arrangement. The CM comprises at least one connection pad and is configured to electrically connect a metallic structure on or in the PCB arrangement to the connection pad of the CM. The HFCC comprises at least one connection pad. At least one bond wire is provided to electrically connect the at least one connection pad to the HFCC to the at least one connection pad of the CM. The CM has a height over the PCB so that the at least one connection pad of the HFCC and at least one connection pad of the CM are on a same level or have a height difference that is less than 2 mm, preferably less than 1 mm, most preferably less than 0.8 mm. A simple and stable mounting is thereby achieved.

The PCB arrangement therein comprises at least one PCB, but also can comprise more than one PCB. In case of the PCB arrangement comprising only one PCB, the PCB arrangement may also be referred to as the PCB.

It is especially noteworthy that advantageously, the top surface of the CM is on the same level, or at least at a similar level, as the top surface of the HFCC, so that mounting, especially using the at least one bond wire is very simple.

According to an implementation form, a first height difference between the at least one connection pad of the HFCC and the PCB arrangement approximately equals a second height difference between the at least one connection pad of the CM and the PCB arrangement. This achieves an identical or at least similar level of the top surfaces and thereby a very easy mounting. Both connection pads are then arranged largely on a same level, parallel to the printed circuit board. An especially short length of bond wires can thereby be achieved.

According to a further implementation form, the CM comprises a top side. The at least connection pad of the CM is arranged on this top side. Moreover, the CM comprises a bottom side. The bottom side of the CM is soldered to the PCB arrangement. A stable mount and an electrical connection are thereby achieved.

According to a further implementation form, the PCB arrangement comprises at least one of the following connection lines:

a durational current, DC, connection line,
a radio-frequency, RF, connection line, and
a ground connection line.

The CM is configured to electrically connect one of the connection lines of the PCB arrangement with its bottom side. The CM comprises an electrical connection between the bottom side and the top side, thereby electrically connecting the at least one connection pad on the top side to the at least one of the connection lines of the PCB arrangement. Thereby, a connection of the connection lines of the PCB to the HFCC is achieved.

According to a further implementation form, the CM comprises a plurality of further connection pads, which are arranged on the top side of the CM. At least a part of the further plurality of connection pads is electrically connected to ground. DC connection lines of the PCB arrangement are connected through further electrical connections within the CM. A connection of further elements is thereby possible. Also, the ground plane reduces spurious emissions.

According to a further implementation form, at least a part of the further connection pads of the CM are electrically connected to further connection pads of the HFCC by further bonding wires. More intricate connections of the HFCC to the PCB arrangement are thereby possible, increasing the possible circuit complexity and bandwidth of connection.

According to a further implementation form, the CM is in the form of a single layer PCB or a multilayer PCB or a ceramic circuit board. This achieves a very simple construction of the CM.

According to a further implementation form, the CM comprises a filter structure configured to smoothen a DC signal, preferably in both directions, and/or suppress certain frequencies in an RF signal. Therefore, the CM acts as a filter. This removes the need for having a dedicated element filter present, if filtering is required.

According to a further implementation form, the CM comprises at least one surface-mounted device, SMD, element arranged on its top side. The surface real estate of the CM can therefore be used for additional components. These components then do not have to be placed at other locations of the circuit. This reduces the amount of necessary space of the circuit.

According to a further implementation form, the circuit module comprises a support. The support is arranged on the PCB arrangement. The HFCC is arranged on the support. Using a support allows for mitigating the effects of different temperature coefficients of the materials of the PCB arrangements and the HFCC. Also, by adjusting the height of the support, it can be assured that the top surface of the HFCC and the top surface of the CM are on an identical, or at least on a similar, level.

According to a further implementation form, the support is screwed to the PCB arrangement. This ensures a secure mount of the support and therefore of the HFCC, but at the same time allows for a simpler replicability of the HFCC without having to unsolder any solder connections.

According to a further implementation form, the HFCC is electrically only connected by its top side. The CM is then electrically connected by both its top side and its bottom side. Therefore, the CM connects the PCB arrangement with its bottom side, and connects the top side of the HFCC with its bottom side. The HFCC is only connected in this manner. Especially, the HFCC is not connected electrically by its bottom side, for example to the support or to other elements. This achieves a very simple connection of the HFCC.

According to a further implementation form, the circuit module comprises a housing, which is configured to enclose both, the HFCC and the CM. The susceptibility of the circuit against emissions, and also the radiation of emissions by the circuit are thereby reduced.

According to a further implementation form, the circuit module comprises an additional capacitance module. The capacitance module is soldered to the PCB arrangement, and electrically connected to a ground structure of the PCB arrangement. The capacitance module has a connection surface on its topside. Bonding wires, electrically connect the connection pad of the HFCC to the connection surface of the capacitance module. Bonding wires electrically connect the connection pad of the CM to the connection surface of the capacitance module. The connection surface of the capacitance module is at a same height level as the connection pad of the HFCC and the connection pad of the CM. In this implementation form, a high capacitance can be achieved.

According to a further implementation form, the circuit module comprises at least another HFCC and at least another CM. The other CM is electrically connected to only one CM or at least two CM. An increase of circuit complexity is thereby possible.

According to a further implementation form, the HFCC comprises a thin film circuit. An especially simple construction of the HFCC is thereby achieved.

According to a second aspect of the invention, a method for manufacturing a previously described circuit module is provided. The method comprises the following steps in the following order:
  soldering the CM to the PCB arrangement,
  mounting the HFCC to the PCB arrangement, and
  bonding the CM to the HFCC.

This achieves a very simple and easily reversible mounting of the HFCC to the PCB arrangement.

BRIEF DESCRIPTION OF THE DRAWINGS

An exemplary embodiment of the invention is now further explained by way of example only with respect to the drawings, in which.

DETAILED DESCRIPTION OF THE PREFERRED EMBODIMENTS

Figure 1:
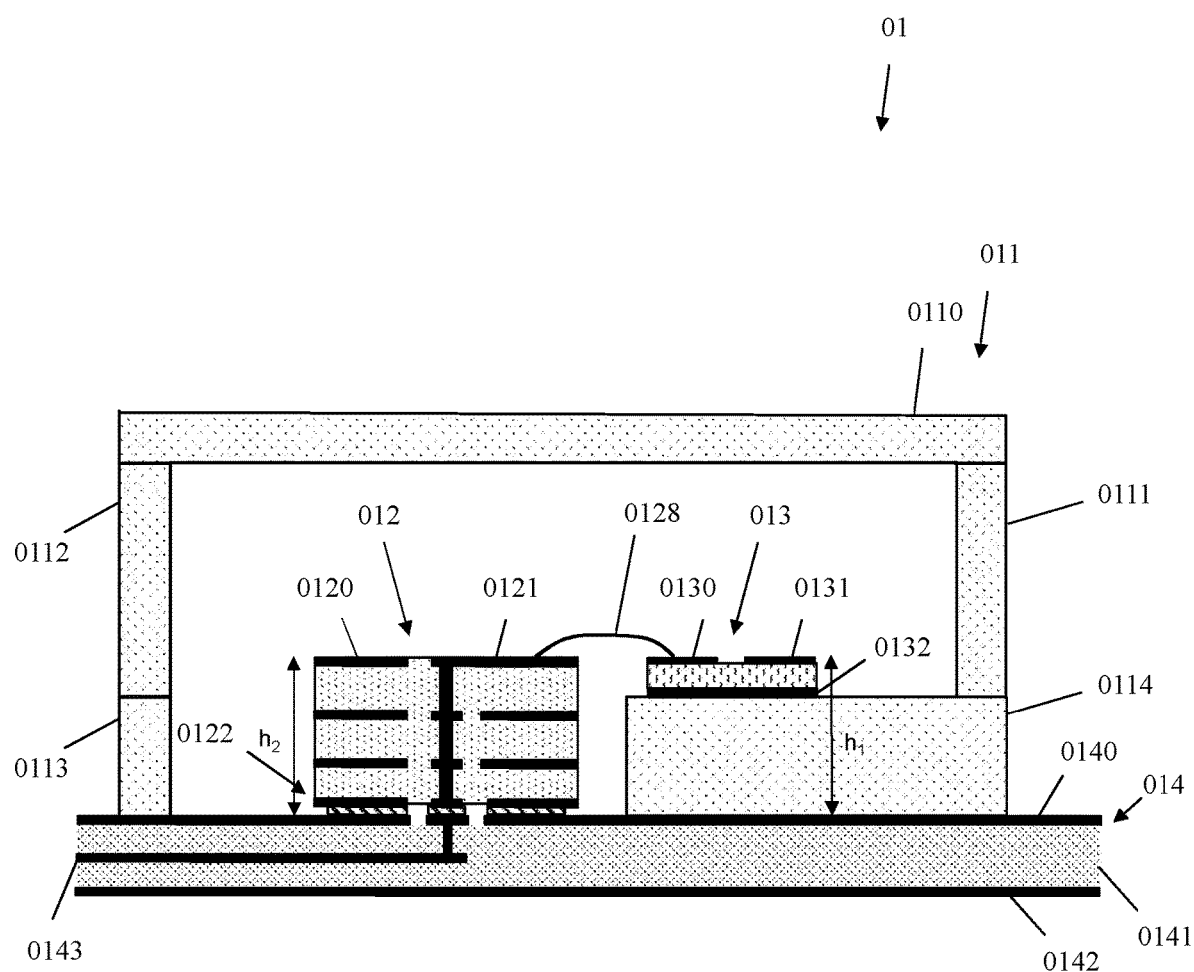
FIG. 1 shows a first embodiment of the inventive circuit module in a cut side-view.

First, we demonstrate the general construction and function of an embodiment of the inventive circuit module along FIG. 1. Along FIG. 2-FIG. 12, further alternative embodiments are shown and described. Finally, along FIG. 13, an embodiment of the inventive mounting method is shown and described in detail. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, a first embodiment of the inventive circuit module 01 is shown. The circuit module 01 comprises a PCB arrangement 014, which here is made up of a single multi-layer PCB. It comprises a top surface metallization layer 0140, an interior metallization layer 0143, and a bottom surface metallization layer 0142. The use of a single-layer PCB is also possible. Also, the PCB arrangement 014 can comprise more than one PCB.

Mounted on the top surface of the PCB arrangement 014, is a connection module 012. The connection module 012 here also is a multi-layer PCB. Also, other construction methods are possible. A single-layer PCB or a ceramic structure or a different structure altogether is possible. The connection module 012 comprises connection pads 0120, 0121 on its top surface and connection pads 0122 on its bottom surface. Interior structures of the connection module 012 connect the connection pads 0122 on the bottom surface to the connection pads 0120, 0121 on the top surface.

The connection pads 0122 on the bottom surface are electrically connected to connection pads of the PCB arrangement 014, which are formed in the metallization layer 0140 of the PCB arrangement 014. Especially, the connection pads are electrically connected by soldering.

The top surface of the connection module 012 stands at a height $h_2$ over the top surface of the PCB arrangement 014.

Moreover, the circuit module 01 comprises a HFCC 013, which is mounted on a support 0114. Especially, the HFCC 013 may be glued or soldered to the support 0114 using a binder 0132. The top surface of the HFCC 013 is formed at least in parts by connection pads 0130, 0131. The top surface of the HFCC 013 stands at a height $h_1$ over the top surface of the PCB arrangement 014.

The height $h_1$ and $h_2$ are preferably identical, or at least similar. The heights $h_1$ and $h_2$ preferably differ no more than by 2 mm, even more preferably they differ by no more than 1 mm, most preferably they differ no more than 0.8 mm.

By setting the heights $h_1$ and $h_2$ this similarly, the use of a very short bond wire 0128 is possible. Also, the mounting process is very simple, since the optics for viewing the bonding process of the bond wire 0128 do not have to be reset for different focal lengths between forming the connections of the two ends of the bond wire 0128. The use of a short bond wire 0128 achieves improved high frequency behavior.

The HFCC 013 and the connection module 012 are connected through at least one bond wire 0128. Especially, the bond wire 0128 connects connection pads 0121 and 0130. It is important to note that here the CM 012 is directly connected to the HFCC 013.

The connection pad 0121 in this embodiment is connected internally in the CM 012 to one of the connection pads 0122 on the bottom surface of the connection pad, which again is connected electrically to a connection pad in the top layer metallization 0140 of the PCB arrangement 014. This connection pad in turn is connected here, internally, to a central layer metallization 0143. For example, a DC connection line, or a ground connection line, or a radio-frequency connection line.

The circuit module 01 moreover comprises a housing 011. In this embodiment, the housing 011 is formed by a plurality of housing elements 0111, 0112, 0113. Here, also the support 0114 forms a part of the housing 011. The housing 011 is preferably electrically conductive, most preferably made from metal, so that it shields the circuit from extraneous emissions, and also prevents emissions from the circuit to the outside. The individual parts of the housing 011 may be screwed or soldered or glued together.

Here, the housing 011 ends at the top surface of the PCB arrangement 014. Also an alternative construction, in which the PCB arrangement 014 is arranged on a part of the housing, the housing completely encasing the PCB arrangement, the connection module, and the HFCC, as well as the support is possible. Also an arrangement of the PCB in a machined recess of a bottom plate of the housing is conceivable.

The HFCC 013 therein can be a thin film circuit, especially on a ceramic substrate or a quartz substrate. It can also be a microchip. The HFCC can for example carry an amplifier. It could then for example amplify signals of higher than 30 GHz, preferably higher than 40 GHz, preferably higher than 50 GHz, preferably higher than 60 GHz, or even preferably higher than 70 GHz. Especially for frequencies over 70 GHz, a ceramic thin film technology may be used for the HFCC 013.

It should be noted that the connection module 012 preferably does not comprise any active elements. An active element is for example an amplifier.

Advantageously, the connection module 012 is an SMD element and can be mounted using an automatic chip-shooter. It can then be soldered onto the circuit board arrangement using a reflow oven.

Advantageously, the connection module 012 has a height of less than 2 cm, preferably less than 1.5 cm, most preferably 0.5 cm. The adjustment of $h_1$ and $h_2$ so that they are similar is preferably achieved mainly through selection of the height of the support 0114.

The connection module 012 can moreover provide for example a capacity by use of its internal structure. The different metallization layers within the connection module 021 form a capacity, which may be used for filtering purposes.

Preferably, all connections of the connection module 012 to the circuit board arrangement 014 are achieved by the connection pads 0122 on the bottom surface of the connection module 012. Advantageously, no other connections between the connection module 012 and the PCB arrangement 014 exist. Especially, through these connections, a supply voltage, a ground connection, and/or an RF-signal are provided.

Second Embodiment

Figure 2:
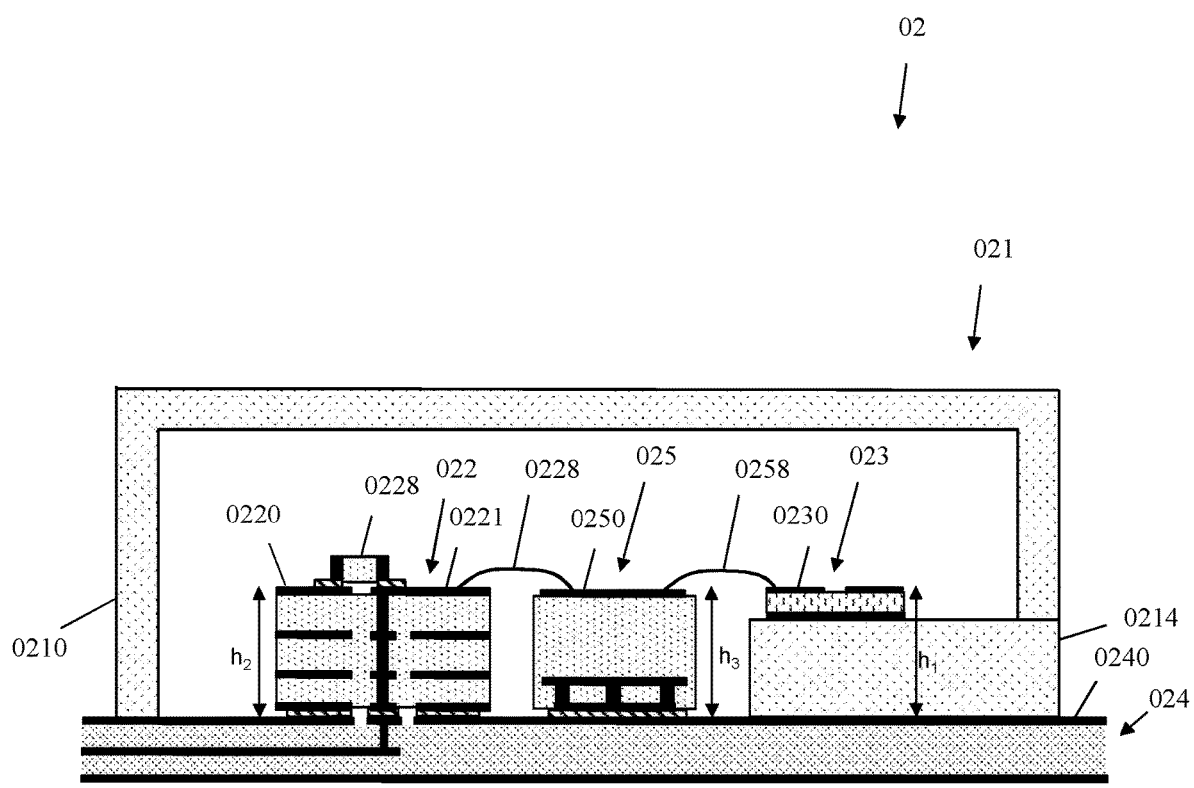
FIG. 2 shows a second embodiment of the inventive circuit module in a cut side-view.

In FIG. 2, a further advantageous embodiment of the inventive circuit module 02 is shown. Here, the circuit module 02 comprises a PCB arrangement 024, which is connected to a connection module 022, to a capacity module 025, and to an HFCC 023.

The connection to the HFCC 023 is achieved through a support 0214. The PCB arrangement 024 is moreover connected to a housing 021, which is formed by a housing element 0210, and the support 0214.

The PCB arrangement 024 comprises a top surface metallization layer 0240, which forms a number of connection pads. These connect to bottom surface connection pads of the connection module 022 and the capacitance module 025. Also, the support 0214 is connected to the top surface metallization layer 0240 of the PCB arrangement 024.

The connection module 022 here comprises top layer connection pads 0220, 0221. These are here connected by an SMD element 0228, preferably a capacitance. Also, other elements may be arranged on the top surface layer of the connection module, which are electrically connected to connection pads on the top surface layer of the connection module 022. Preferably, no active components are arranged here.

The capacitance module 025 comprises a top surface metallization layer, forming a connection pad 0250. This connection pad 0250 is connected to connection pad 0221 of the CM 022 through a bond wire 0228 and to a connection pad 0230 of the HFCC 023 through a bond wire 0258. The top surface of the HFCC 023 rises by a height $h_1$ over the top surface of the PCB arrangement 024. The top surface of the CM 022 rises by a height $h_2$ over the top surface of the PCB arrangement 024. The top surface of the capacitance module 025 rises by a height $h_3$ over the top surface of the PCB arrangement 024. $h_1$, $h_2$ and $h_3$ are largely identical. Preferably, they differ by no more than 2 mm, even more preferably, they differ by no more than 1 mm, most preferably, the differ by no more than 0.8 mm.

The housing 021 here is constructed only from a single housing element 0210 and the support 0214. This achieves an even tighter shielding against emissions in both directions than the multi-part housing of FIG. 1.

It is important to note that in the embodiment of FIG. 2, the CM 022 is indirectly connected to the HFCC 023, especially through the capacitance module 025.

Third Embodiment

Figure 3:
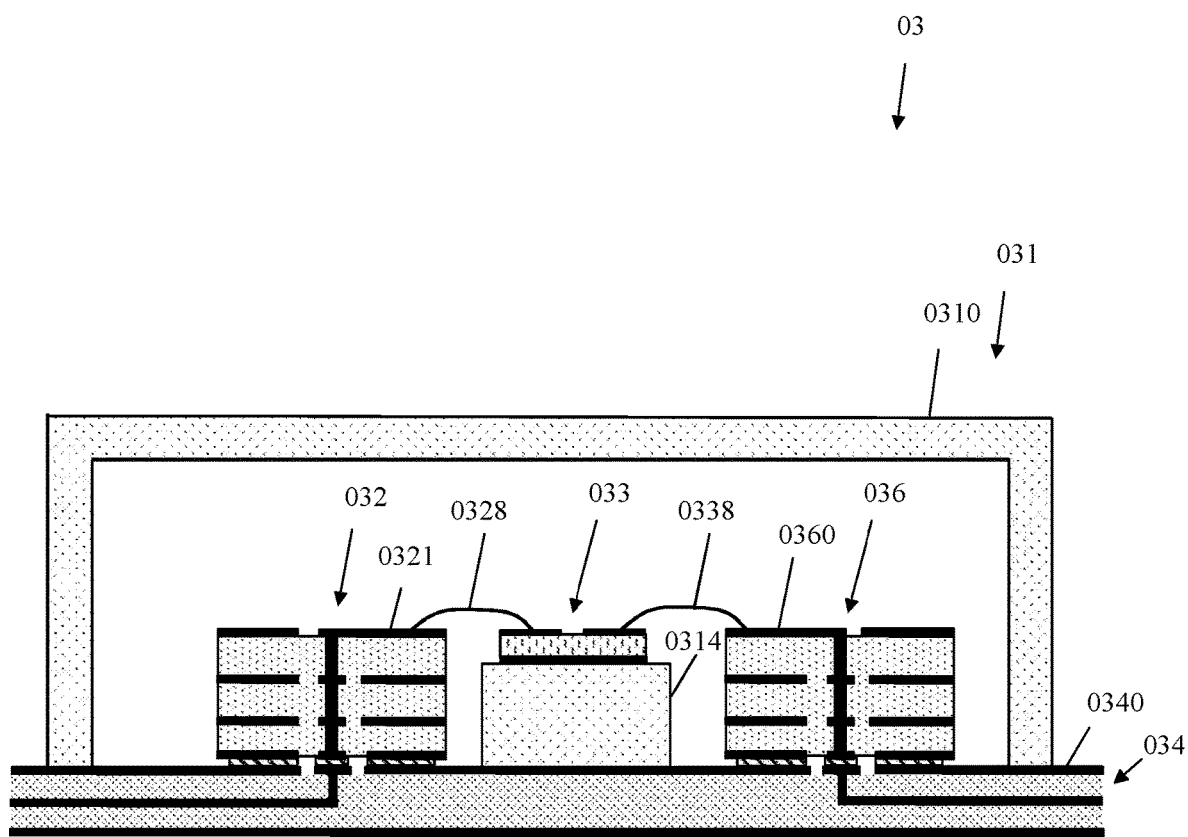
FIG. 3 shows a third embodiment of the inventive circuit module in a cut side-view.

In FIG. 3, a third embodiment of the inventive circuit module 03 is shown. The circuit module 03 here comprises a PCB arrangement 034, and connection modules 032, 036, a support 0314, and a housing 031, arranged on the PCB arrangement 034.

On a top surface of the support 0314, a HFCC 033 is arranged. Here, the HFCC 033 is connected by two separate CMs 032, 036. The CMs 032, 036 are connected to the PCB arrangement 034 through bottom surface connection pads, which are connected to top surface connection pads formed in the top surface metallization layer 0340 of the PCB arrangement 034.

Through internal connections, within the connection modules 032, 036, top surface connection pads 0321, 0360 of the CMs 032, 036 are connected to connection lines within the PCB arrangement 034. The connection pad 0321 of the CM 032 is connected through a bond wire 0328 to a connection pad on the top surface of the HFCC 033. The connection pad 0360 of the CM 036 is connected through a bond wire 0338 to a connection pad on the top surface of the HFCC 033. This arrangement allows for an increase of the number of connections of the HFCC.

It is important to note that the housing 031 here is formed from a single housing element 0310. The support 0314 is not part of the housing 031, here.

Especially, for example the CM 032 can provide an input signal to the HFCC, while the CM 036 can provide an output signal of the HFCC 033.

Fourth Embodiment

Figure 4:
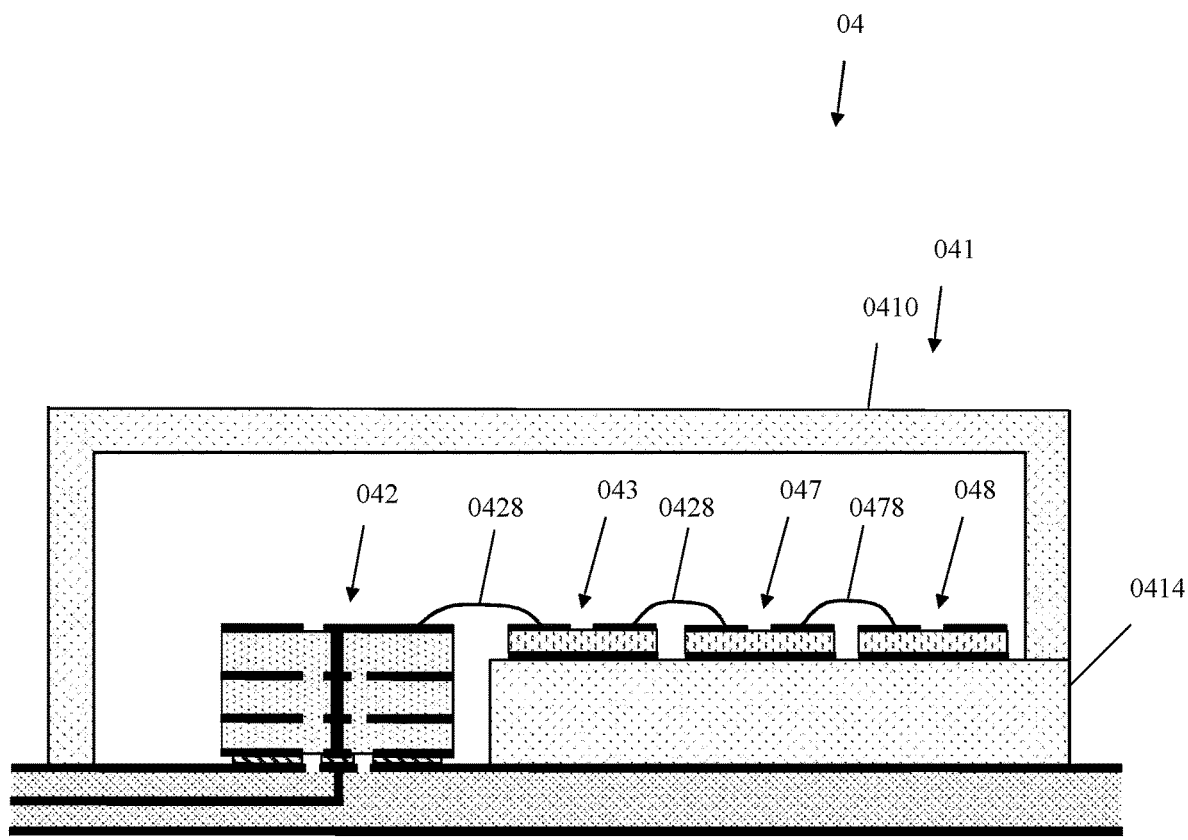
FIG. 4 shows a fourth embodiment of the inventive circuit module in a cut side-view.

A further embodiment of the circuit module 04 is shown in FIG. 4. Here, the circuit module 04 comprises a single CM 042 and a plurality of HFCCs 043, 047, 048. All three HFCCs 043, 047, 048 are here arranged on a support 0414, which is part of a housing 041, which moreover comprises a single housing element 0410 encasing the circuit.

The CM 042, especially a connection pad on a top surface of the CM 042 is connected to the connection pad on the top surface of the HFCC 043 through a bond wire 0428. The HFCC 043 is connected to the HFCC 047 by a bond wire 0428, which is connected to connection pads on the top surfaces of the HFCCs 043, 047. Also, HFCCs 047, 048 are connected to each other through connection pads on their respective top surfaces, which are connected through a bond wire 0478.

Fifth Embodiment

Figure 5:
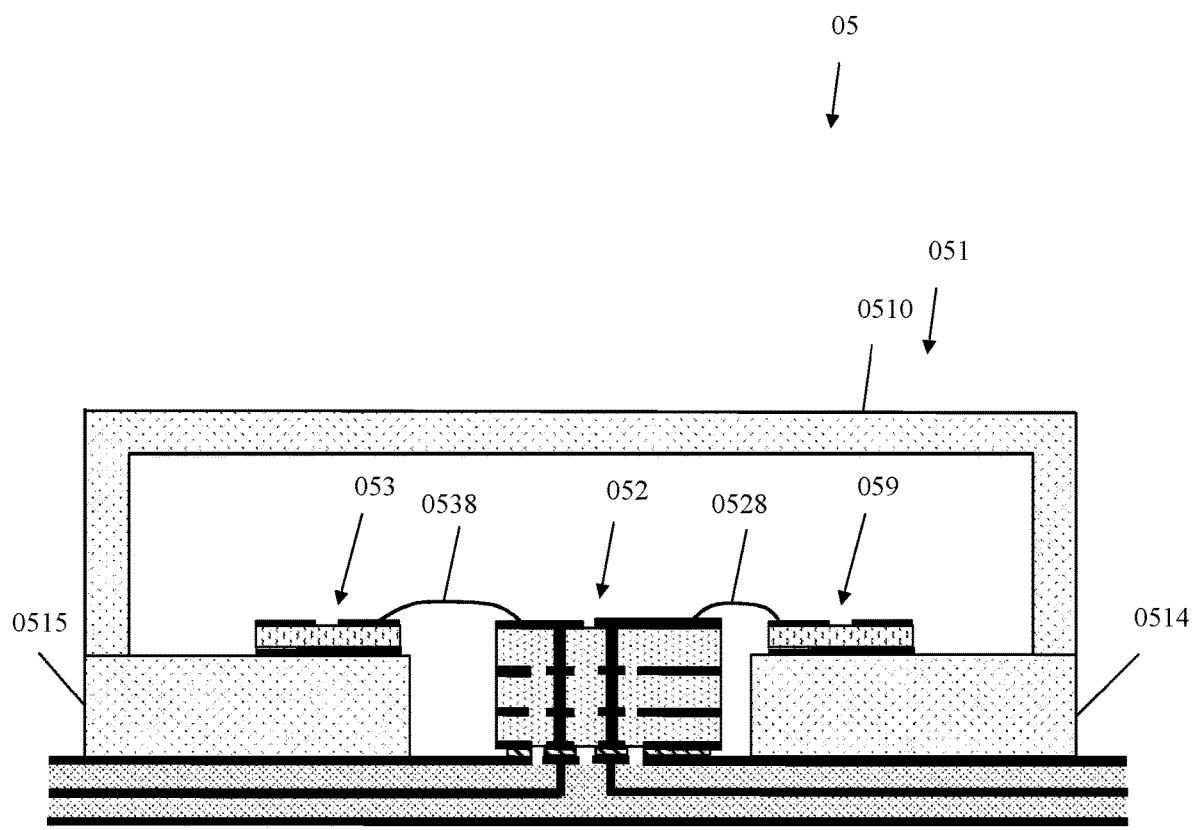
FIG. 5 shows a fifth embodiment of the inventive circuit module in a cut side-view.

In FIG. 5, a further embodiment of the circuit module 05 is shown. Here, the circuit module 05 comprises a housing 051, which is comprised by two separate supports 0514, 0515, and a housing element 0510 which encases the circuit. Arranged on the supports 0514, 0515, are separate HFCCs 053, 059. A single CM 052 is arranged between the support 0514, 0515 on the top surface of the PCB arrangement.

Connection pads on the top surface of the CM 052 are connected to connection pads of the HFCC 053, 059 through bond wires 0538, 0528. In this embodiment, different connection lines from within the PCB arrangement are connected to the different HFCCs 053, 059.

Instead of using two separate supports 0514, 0515, as shown in this cut side-view, also the use of a joint support, with a hole for the CM 052 to be connected to the PCB arrangement can be used. In the top-view, such a support would have a C-shape or an O-shape.

Sixth Embodiment

Figure 6:
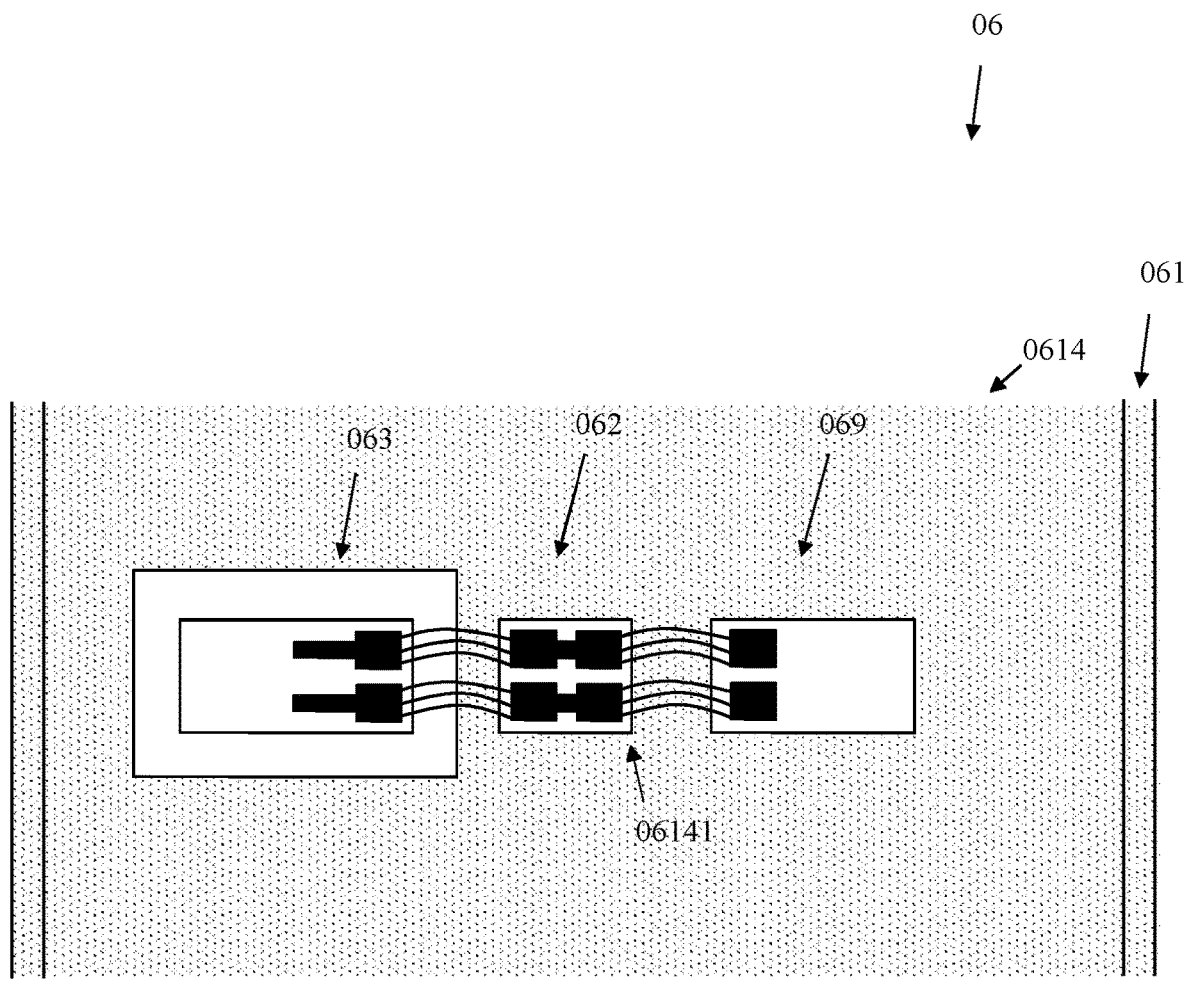
FIG. 6 shows a sixth embodiment of the inventive circuit module in a top-view.

In FIG. 6, a further embodiment of the inventive circuit module 06 is shown in a top-view. Here, the circuit module 06 comprises a housing 061, which again comprises a support 0614, which has a hole 06141 for the connection module 062. The connection module 062 here is connected to a first HFCC 063 and a second HFCC 069. Both HFCCs 063, 069 are arranged on the support 0614, while the CM 062 is arranged in the hole 06141 of the support 0614, on the top surface of the PCB arrangement, as shown in FIG. 5.

Seventh Embodiment

Figure 7:
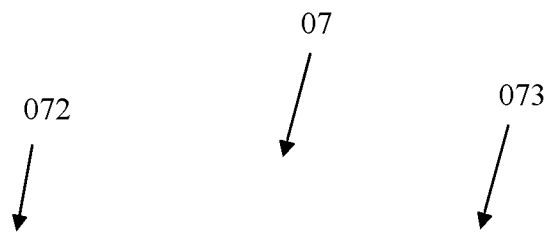
FIG. 7 shows a seventh embodiment of the inventive circuit module in a top-view.
Figure 7:
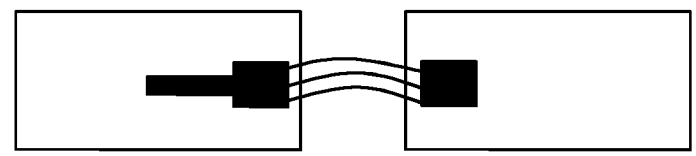

In FIG. 7, a further embodiment of the circuit module is shown in a top-view. Here, a CM 072 is connected to a HFCC 073 by three bond wires connecting the same connection pads. The use of more than one bond wire increases reliability and improves HF behavior.

Eighth Embodiment

Figure 8:
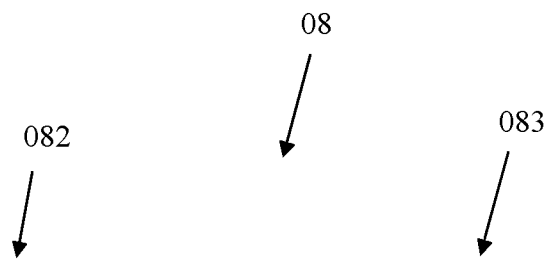
FIG. 8 shows an eighth embodiment of the inventive circuit module in a top-view.
Figure 8:
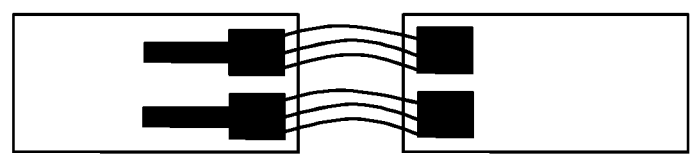

In FIG. 8, a further embodiment of the circuit module 08 is shown. Here, the circuit module 08 comprises a CM 082 and an HFCC 083, which each comprise two connection pads on their top surface. Each of the connection pads of the CM 082 is connected to one of the connection pads 083 of the HFCC by use of three parallel bond wires. Also, the use of only one bond wire or the use of a different number of bond wires is possible.

By using the two different connection pads, different signal lines may be connected to the HFCC. For example, two different RF signals, or an RF signal and a DC signal, or an RF signal and ground may be connected in this manner.

Ninth Embodiment

Figure 9:
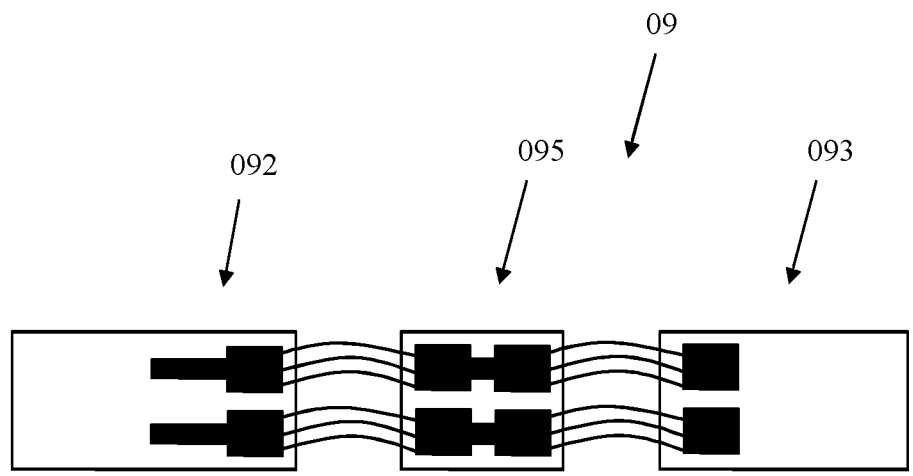
FIG. 9 shows a ninth embodiment of the inventive circuit module in a top-view.

In FIG. 9, a further embodiment of the inventive circuit module 09 is shown. The circuit module 09 comprises a CM 092, which comprises two connection pads on its top surface. Moreover, circuit module 03 comprises a capacitance module 095, which also comprises two separate connection pads on its top surface. Finally, circuit module 09 comprises a HFCC 093, which also comprises two separate connection pads on its top surface.

One connection pad of the CM 092 is connected to one of the connection pads of the capacitance module 095 through three parallel bond wires. The same connection pad of the capacitance module 095 is connected by three parallel bond wires to one of the connection pads of the HFCC 093.

The other connection pad of the CM 092 is also connected by three parallel bond wires to the other connection pad of the capacitance module 095, which is in turn connected by three parallel bond wires to the other connection pad of the HFCC 093.

The capacitance module 095 provides a capacitance to ground between the respective connection pads of the CM 092 and the HFCC 093. This is also shown in FIG. 2.

Tenth Embodiment

Figure 10:
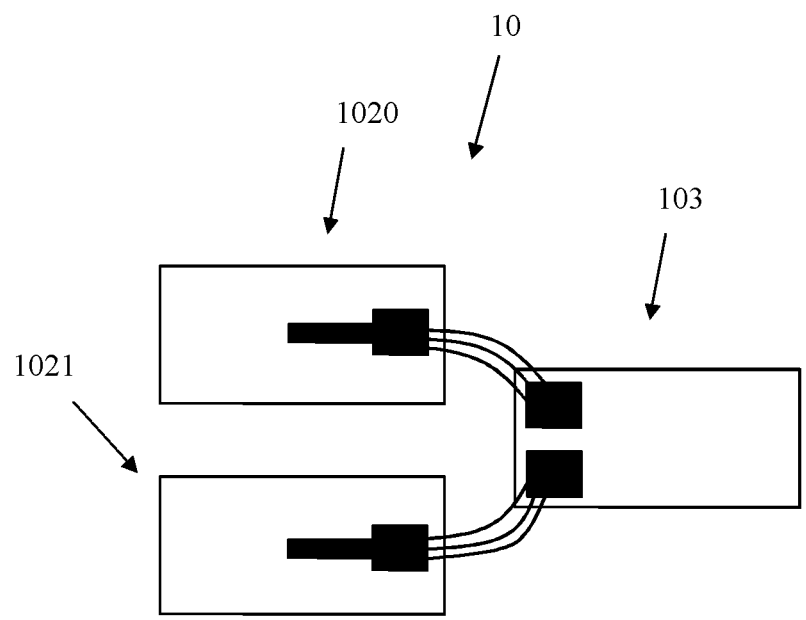
FIG. 10 shows a tenth embodiment of the inventive circuit module in a top-view.

In FIG. 10, a further embodiment of the inventive circuit module 10 is shown. Here, two separate CMs 1020, 1021 and a single HFCC 103 are provided. The CMs 1020, 1021 each comprise a single connection pad on their top surface, which are each connected by three parallel bond wires to two separate connection pads on the top surface of the HFCC 103. By using two different CMs 1020, 1021, the respectively provided signals can be kept separate as long as possible. The signals are thereby decoupled as well as possible.

Eleventh Embodiment

Figure 11:
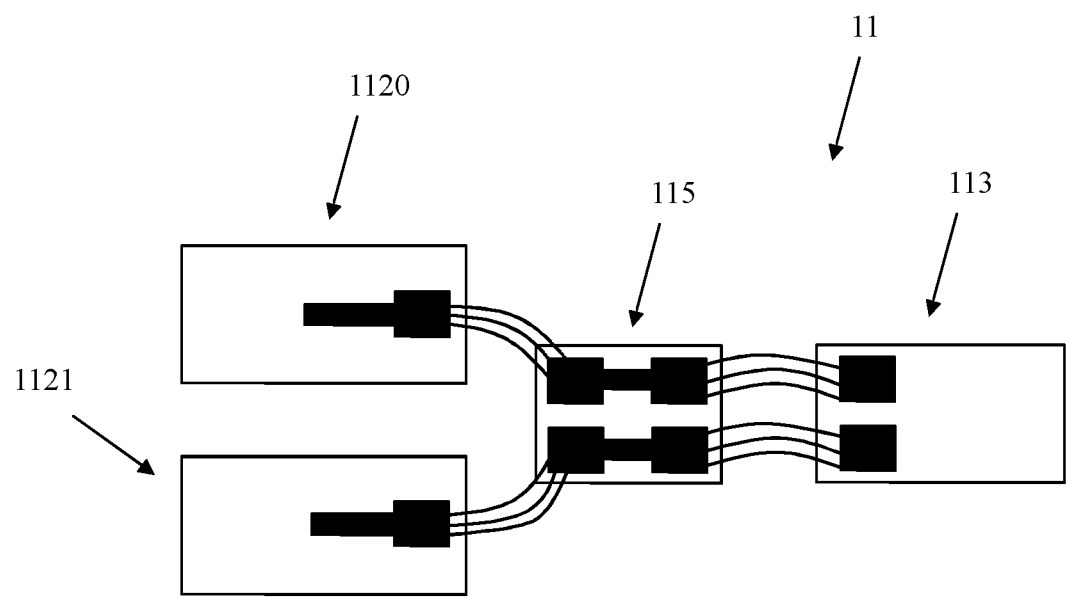
FIG. 11 shows an eleventh embodiment of the inventive circuit module in a top-view.

In FIG. 11, a further embodiment of the circuit module 11 is shown. The circuit module 11 here comprises two separate CMs 1120, 1121, a capacitance module 115 and a HFCC 113. The CMs 1120, 1121 each comprise a single connection pad on their top surface, which is respectively connected to separate connection pads on the top surface of the capacitance module 115 using three parallel bond wires, each. The respective connection pads of the capacitance module 115 are again connected to separate connection pads on the top surface of the HFCC 113 using three parallel bond wires.

The capacitance module 115 is therein configured to provide two separate capacities for the two separate signals provided by the CMs 1120, 1121.

Twelfth Embodiment

Figure 12:
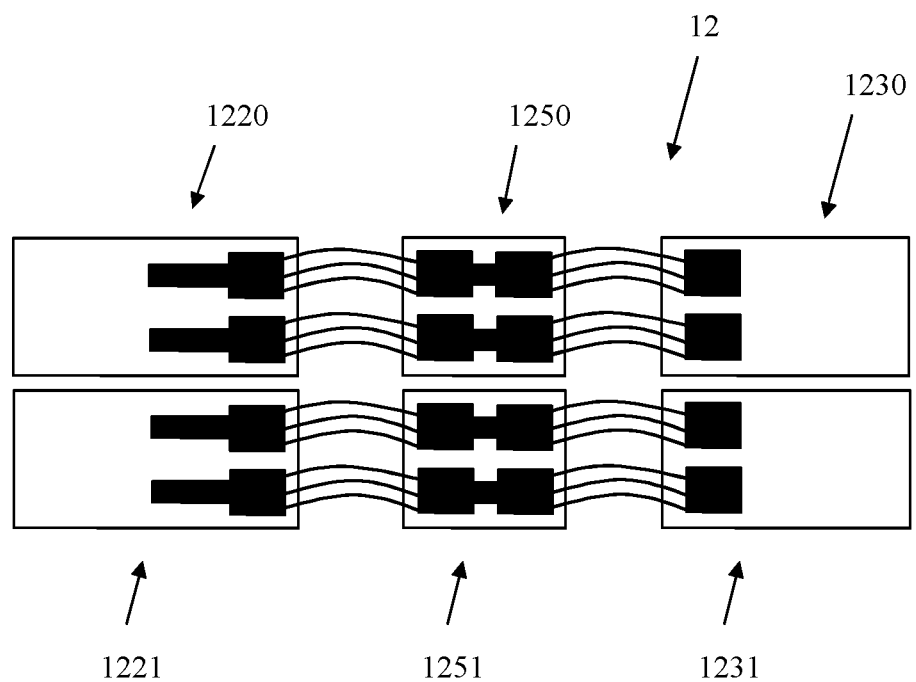
FIG. 12 shows a twelfths embodiment of the inventive circuit module in a top-view.

In FIG. 12, a further embodiment of the circuit module 12 is shown. Here, the circuit module 12 comprises two separate CMs 1220, 1221, two separate capacitance modules 1250, 1251, and two separate HFCCs 1230, 1231. The first CM 1220 comprises two connection pads on its top surface, which each are connected to one of two connection pads of the first capacity module 1250, each through three parallel bond wires. The respective connection pad of the first capacity module 1250 is connected to a single of two connection pads of the HFCC 1230, again through three parallel bond wires.

The two contact pads of the second CM 1221 are connected in a similar manner to the two connection pads of the second capacity module 1251, which are again connected in a similar manner to the two connection pads of the second HFCC 1231. Therefore, four separate signal connections are provided. Each of the signal connections is provided with a separate capacitance by the capacitance module 1250, 1521.

Thirteenth Embodiment

Figure 13:
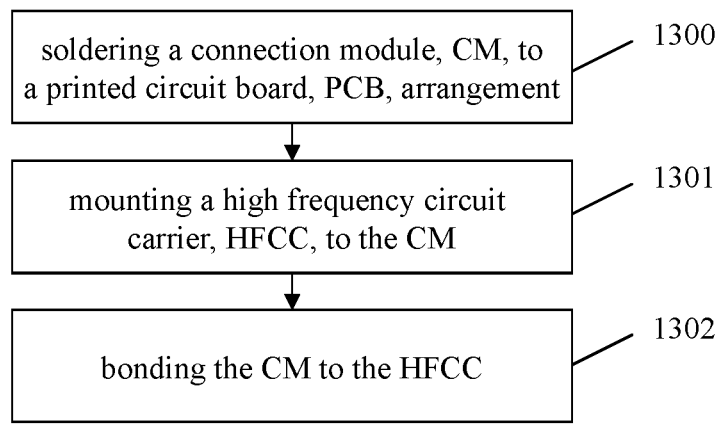
FIG. 13 shows and embodiment of the inventive mounting method in a flow-diagram.

In FIG. 13, an embodiment of the inventing mounting method is shown. The method serves the purpose of mounting a HFCC on a PCB arrangement.

In order to do so, in a first step 1300, a CM is soldered to a PCB arrangement.

In a second step 1301, a HFCC is mounted to the CM. This can for example be done by gluing, soldering, screwing, clamping, etc.

In a third step 1302, the CM is bonded to HFCC, for example using bond wires.

It is important to note that the invention comprises the use of different numbers of CMs, capacitance modules, HFCCs and bond wires. Although the individual embodiments how specific numbers for the individual components, it is to be understood that the invention is targeted at the general construction but not limited by specific numbers of components. Also, instead of one or more bond wires, ribbons, foil, mesh or micro coaxial cables can be used.

Although the present invention and its advantages have been described in detail, it should be understood, that various changes, substitutions and alterations can be made herein without departing from the spirit and scope of the invention as defined by the appended claims.

What is claimed:

1. A circuit module comprising the following features:—a printed circuit board, PCB, arrangement,—a connection module, CM,—a high frequency circuit carrier, HFCC, wherein the HFCC is arranged on the PCB arrangement, wherein the CM is mounted on the PCB arrangement, wherein the CM comprises at least one connection pad and is configured to electrically connect a metallic structure on or in the PCB arrangement to the connection pad of the CM, wherein the HFCC comprises at least one connection pad, wherein at least one bond wire is provided to electrically connect the at least one connection pad of the HFCC to the at least one connection pad of the CM, wherein the CM has a height over the PCB arrangement so that the at least one connection pad of the HFCC and the at least one connection pad of the CM are on a same level or have a height difference that is less than 2 mm, preferably less than 1 mm, most preferably less than 0.8 mm, wherein a first height difference between the at least one connection pad of the HFCC and the PCB arrangement approximately equals a second height difference between the at least one connection pad of the CM and the PCB arrangement.

2. The circuit module of claim 1,
wherein the CM comprises a top side,
wherein the at least one connection pad of the CM is arranged on the top side;
wherein the CM comprises a bottom side,
wherein the bottom side of the CM is soldered to the PCB arrangement.

3. The circuit module of claim 2,
wherein the PCB arrangement comprises at least one of the following connection lines:
a durational current, DC, connection line,
a radio frequency, RF, connection line,
a ground connection line,
wherein the CM is configured to electrically connect one of the connection lines of the PCB arrangement with its bottom side, and
wherein the CM comprises an electrical connection between the bottom side and the top side, thereby electrically connecting the at least one connection pad on the top side to the at least one of the connection lines of the PCB arrangement.

4. The circuit module of claim 1,
wherein the CM comprises a plurality of further connection pads, which are arranged on the top side of the CM;
wherein the further plurality of connection pads are electrically connected to ground, and
wherein DC connection lines of the PCB arrangement are connected through further electrical connections within the CM.

5. The circuit module of claim 4,
wherein the further connection pads of the CM are electrically connected to further connection pads of the HFCC by further bonding wires.

6. The circuit module of claim 1,
wherein the CM is in the form of
a single layer PCB, or
a multi layer PCB, or
a ceramic circuit board.

7. The circuit module of claim 1,
wherein the CM comprises a filter structure configured to:
smoothen a DC signal, preferably in both directions, and/or
suppress certain frequencies in an RF signal.

8. The circuit module of claim 1,
wherein the CM comprises at least one surface mounted device, SMD, element arranged on its top side.

9. The circuit module of claim 1,
wherein the circuit module comprises a support,
wherein the support is arranged on the PCB arrangement, and
wherein the HFCC is arranged on the support.

10. The circuit module of claim 9,
wherein the support is screwed to the PCB arrangement.

11. The circuit module of claim 1,
wherein the HFCC is electrically only connected by its top side, and
wherein the CM is electrically connected both by its top side and its bottom side.

12. The circuit module of claim 1,
wherein the circuit module comprises a housing, and
wherein the housing is configured to enclose both the HFCC and the CM.

13. The circuit module of claim 1,
wherein the circuit module comprises at least another HFCC and at least another CM, and
wherein the another HFCC is electrically connected to only one CM, or to at least two CM.

14. The circuit module of claim 1,
wherein the HFCC comprises a thin film circuit.

15. A method for manufacturing a circuit module according to claim 1, comprising the following steps in the following order:
soldering the CM to the PCB arrangement,
mounting the HFCC to the PCB arrangement, and
bonding the CM to the HFCC.

\* \* \* \* \*